US006334248B1

(12) United States Patent
Gallagher

(10) Patent No.: US 6,334,248 B1
(45) Date of Patent: Jan. 1, 2002

(54) APPARATUS AND METHOD FOR THE CONTINUOUS HIGH SPEED ROTARY APPLICATION OF STAMPING FOIL

(75) Inventor: Terence J. Gallagher, Brookfield, CT (US)

(73) Assignee: Total Register, Inc., Brookfield, CT (US)

(*) Notice: Subject to any disclaimer, the term of this patent is extended or adjusted under 35 U.S.C. 154(b) by 457 days.

(21) Appl. No.: 08/784,752

(22) Filed: Jan. 16, 1997

Related U.S. Application Data

(60) Provisional application No. 60/026,403, filed on Sep. 20, 1996.

(51) Int. Cl.[7] .............................. H05K 3/02; H05K 3/10

(52) U.S. Cl. ............................ 29/846; 29/17.3; 29/709; 29/712; 29/335; 29/738; 242/538.2; 156/540; 156/233; 156/234; 156/361

(58) Field of Search ................................ 29/17.1, 17.2, 29/17.4, 709, 712, 33 Q, 335, 738, 739, 846; 242/538.2; 156/540, 233, 234, 361, 358

(56) References Cited

U.S. PATENT DOCUMENTS

| | | | | |
|---|---|---|---|---|
| 2,981,432 A | | 4/1961 | Flood | |
| 3,217,637 A | | 11/1965 | Worth | |
| 4,003,298 A | | 1/1977 | Schott | |
| 4,063,500 A | | 12/1977 | Abe | |
| 4,180,608 A | * | 12/1979 | Del | 428/196 |
| 4,411,982 A | * | 10/1983 | Shibuya et al. | 430/314 |
| 4,541,335 A | | 9/1985 | Tokuno et al. | |
| 4,682,415 A | * | 7/1987 | Adell | 29/846 |
| 4,701,235 A | | 10/1987 | Mitsam | |
| 4,701,239 A | * | 10/1987 | Craig | 156/519 |
| 5,022,950 A | | 6/1991 | Ingalls et al. | |
| 5,104,471 A | | 4/1992 | Antes et al. | |
| 5,111,572 A | * | 5/1992 | Haiml et al. | 29/469.5 |
| 5,184,111 A | * | 2/1993 | Pichl | 340/572 |
| 5,207,855 A | * | 5/1993 | Nyfeler et al. | 156/351 |
| 5,325,583 A | * | 7/1994 | Shimizu et al. | 29/849 |
| 5,378,581 A | * | 1/1995 | Vernon | 430/313 |
| 5,618,378 A | | 4/1997 | Cahill | |

FOREIGN PATENT DOCUMENTS

| | | |
|---|---|---|
| DE | 3445012 | 6/1985 |
| EP | 0244348 | 11/1987 |
| EP | 0453168 A1 | 4/1991 |
| GB | 2033846 | 11/1982 |
| GB | 2254586 A | 4/1991 |
| WO | WO8300659 | 3/1983 |
| WO | WO9413487 | 6/1994 |

OTHER PUBLICATIONS

A one page sketch "DMS Solution" that describes the structure and operation of a machine manufactured and sold by DMS of Chicago more than one year prior to the filing of the provisional priority application.

* cited by examiner

*Primary Examiner*—Lee Young
*Assistant Examiner*—Rick Kiltae Chang
(74) *Attorney, Agent, or Firm*—Skjerven Morrill MacPherson LLP

(57) ABSTRACT

A technique and machine for transferring discrete areas of material, such as hot stamping foil, from a carrier onto positions spaced apart along a substrate, such as paper. The carrier is dispensed at a rate that is much less than the speed of movement of the substrate. During transfer, a segment of the carrier is moved at the same speed as the substrate while, in between such material transfers, the speed of the carrier is sharply reduced and even reversed in direction in order to maintain the average speed of this carrier segment equal to the reduced speed at which the carrier is being dispensed. This is accomplished by a shuttle mechanism that is moved by its own motor, under control of a microprocessor-based motor control system, in synchronism with the speed of the substrate and transfer operations. This significantly improves the utilization of the material on the carrier, with an improved flexibility to adapt to various substrate speeds and ease of implementation in machinery.

21 Claims, 7 Drawing Sheets

APPARATUS AND METHOD FOR THE CONTINUOUS HIGH SPEED ROTARY APPLICATION OF STAMPING FOIL

CROSS-REFERENCE TO RELATED APPLICATION

This application claims the benefit of provisional application No. 60/026,403, filed Sep. 20, 1996.

BACKGROUND OF THE INVENTION

This invention relates generally to the continuous, high speed transfer of material from a carrier to a substrate, such as the hot stamping of foil in printing machines, and more particularly to high speed rotary printing machines, such as but not limited to flexographic, letterpress and rotary screen printing machines.

One form of hot stamping foil comprises a carrier or backing film and a decorative layer thereon. The decorative layer may comprise at least one layer of lacquer and optionally a layer of adhesive and other layers. For example a separation or partition layer may be provided between the backing film and the layer of lacquer, to promote separation of the decorative layer from the backing film. A metal or color layer may be disposed between the lacquer and adhesive layer.

The layers of lacquer, metal and adhesive are transferred to a substrate with heat and pressure, using a rotary brass die. The backing film may be formed of one of a number of plastic or other materials including but not limited to a polyester such as polyethylenephthalate, oriented polypropylene, polyvinyl chloride, styrene, acetate, coated and uncoated paper, cardboard, hard plastics such as polyolefins (high and low density polyethylene), polystyrene and related plastics or halogenated polyolefin polymers such as polyvinyl chloride.

Normally, rotary hot stamping is carried out using (1) a metal, usually brass, application or impression roller with raised areas configured to the shape of the desired area to be hot stamped, with the surface of such roller being heated to between 250 and 400 degrees Fahrenheit, and (2) an adjacent base or anvil roller. During the rotary hot stamping process, the layers of lacquer, metal and sometimes adhesive are separated from the carrier or backing film of the foil. In conventional rotary hot stamping, an adhesive is used and the hot stamping foil is nipped between the two rollers. In the case where an adhesive is not present on the foil, it is usually applied to the substrate in selected areas. The supporting base or anvil roller is made from vulcanized silicone rubber having a hardness of between 80 to 100 durometer, or an ebonite roller having a hardness of approximately 100 durometer. As the substrate of plastic film, paper or other sheet material to which the decoration is to be applied passes over the anvil roller, it contacts the surface of the hot stamping foil opposite the backing film. The substrate and the foil are carried together between the heated brass impression roller and the anvil roller, with the backing film facing the heated brass impression roller surface and the layers to be hot stamped or transferred facing the substrate.

An object of the present invention is to provide method and apparatus for economical, high speed continuous rotary application of material such as stamping foil to a substrate, and more particularly to the application of hot stamping foil to a substrate.

Another object of the present invention is to improve the utilization of the material, such as hot stamp foil, that is being transferred, thus to reduce the waste of such material that occurs with present machines and processes.

SUMMARY OF THE INVENTION

In accordance with the present invention, there is provided a method of continuous rotary transfer of material from a carrier to a substrate, such as hot-stamping, in which the material, such as hot stamp foil, is utilized much more efficiently than prior techniques. A method is provided whereby a carrier of the foil is both unwound from its supply roll and rewound onto a waste roll at a speed proportional to and substantially less than the speed of the substrate, while at the same time the portions of the carrier and foil in the vicinity of the nip transfer point undergo changes in velocity such that the foil is synchronous with the substrate during the actual transfer of foil from the carrier to the substrate. The apparatus and method of the present invention are extremely efficient in that they permit the continuous high speed rotary application of hot stamping foil while utilizing as much as 95% of the surface area of such foil, thereby minimizing the amount of scrap foil.

In a specific implementation, the changes in velocity are accomplished by means of a microprocessor-controlled shuttle mechanism receiving input signals from a position-sensing device indicating substrate motion, and one or more position sensors indicating the position of the raised stamping areas. A typical implementation consists of an attachment to a printing press having a continuous substrate, typically paper or plastic. The anvil and impression rollers are typically gear-driven from the press itself. The attachment is self powered independent from the press.

It is a goal of the invention, according to a specific aspect, that the process of rotary hot-stamping take place at high speeds compatible with the rate at which flexographic and similar printing presses are used, namely 100 feet/minute to 400 feet/minute. In order to effect these speeds it is desirable to keep to a minimum those portions of the foil drive which undergo velocity changes, several methods of achieving this will be described herein.

Additional objects, advantages and features of the present invention are described below with respect to its preferred embodiments, which description should be taken with the accompanying drawings.

DESCRIPTION OF THE PRIOR ART

Figure 1:
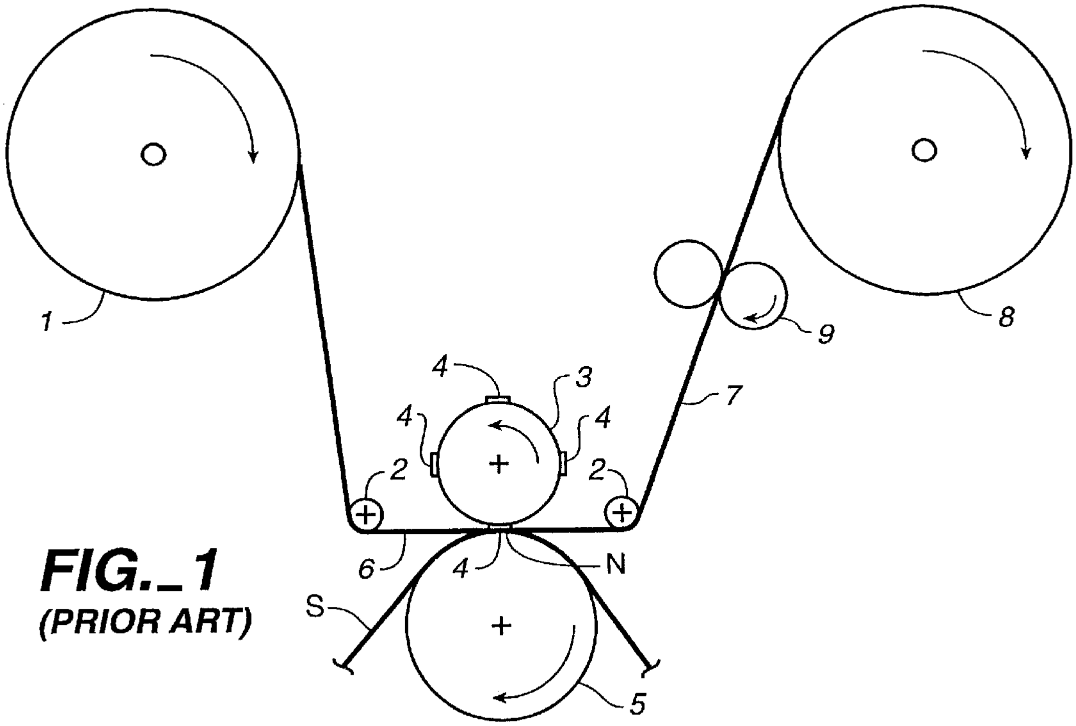
FIG. 1 (PRIOR ART)
FIG. 1 is a schematic view showing a conventional foil feed system for hot stamping selected portions of the foil onto a substrate.

Referring to FIG. 1, the prior art apparatus includes an unwind wheel 1 from which hot stamping foil F is supplied. The foil F is fed over a first guide roller 2 and into the gap between a heated brass impression roller 3 and an anvil roller 5. As it passes in the gap between the impression roller 3 and the anvil roller 5, the foil F comes in contact with a substrate 6 moving at the same speed.

Figure 2:
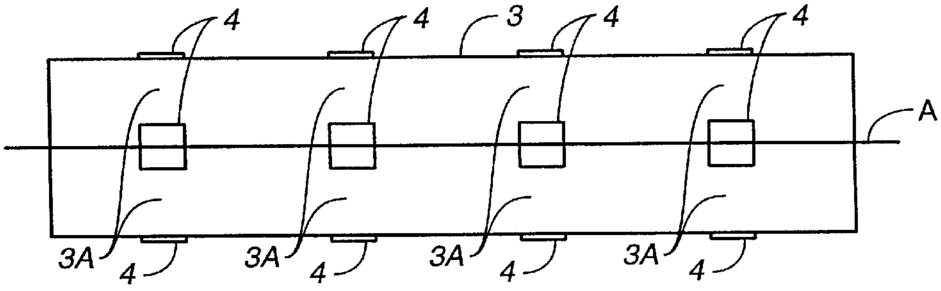
FIG. 2 is a perspective view of an impression roller used as part of the conventional foil feed system of FIG. 1.

The impression roller 3 is provided with one or more raised areas 4 each of which extends in a direction parallel to the axis A. (See the side view of FIG. 2). In the case shown in FIG. 2, the raised areas 4 are equally spaced circumferentially around the impression roller 90 degrees from one another. Between each pair of adjacent raised areas 4 of the impression roller 3, is a recessed area 3A.

As the substrate 6 and the foil F in contact therewith pass between the impression roller 3 and the anvil roller 5, a nip N will be created each time one of the raised areas 4 rotates to the six o'clock position shown in FIG. 1 to cause the foil F to be firmly engaged under heat and pressure to the substrate 6 trapped in the nip N between the anvil roller 5 and the raised area 4 and thereby causing the releasable portion of the foil F to be released from its carrier film and transferred to the substrate 6.

Figure 3:
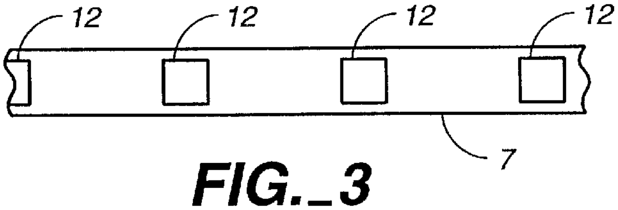
FIG. 3 is a plan view of a length of foil after passing through the nip of the impression roll and the anvil roll of the machine of FIG. 1 to transfer successive sections of the decorative layer from the carrier sheet to a substrate.

The stamping foil F exiting from the impression roller 3 and anvil roller 5 may be referred to as used hot stamping foil 7 and is shown as passing over a second guide roller 2, through a pair of drive rollers 9, which drive the foil at the same speed as the substrate, and thereafter collected as used waste foil on rewind roll 8. A length of used hot stamping foil 7 is shown in FIG. 3. As may be clearly seen, the portions of the foil which were transferred to the substrate 6 are illustrated as windows 12. As will be appreciated, each of the windows 12 consist solely of the carrier film as the remainder of the layers making up the foil F have been transferred by the raised areas 4 to the substrate 6. As can be seen in FIG. 3, the windows 12 are spaced apart a distance equal to the space between adjacent ones of the raised areas 4 on the impression roller 3. As a result, the portion of foil between each of the adjacent windows 12 which could have been available for hot stamping, is not used and ends up as part of the waste foil rewind 8.

DESCRIPTION OF THE PREFERRED EMBODIMENTS

Figure 4:
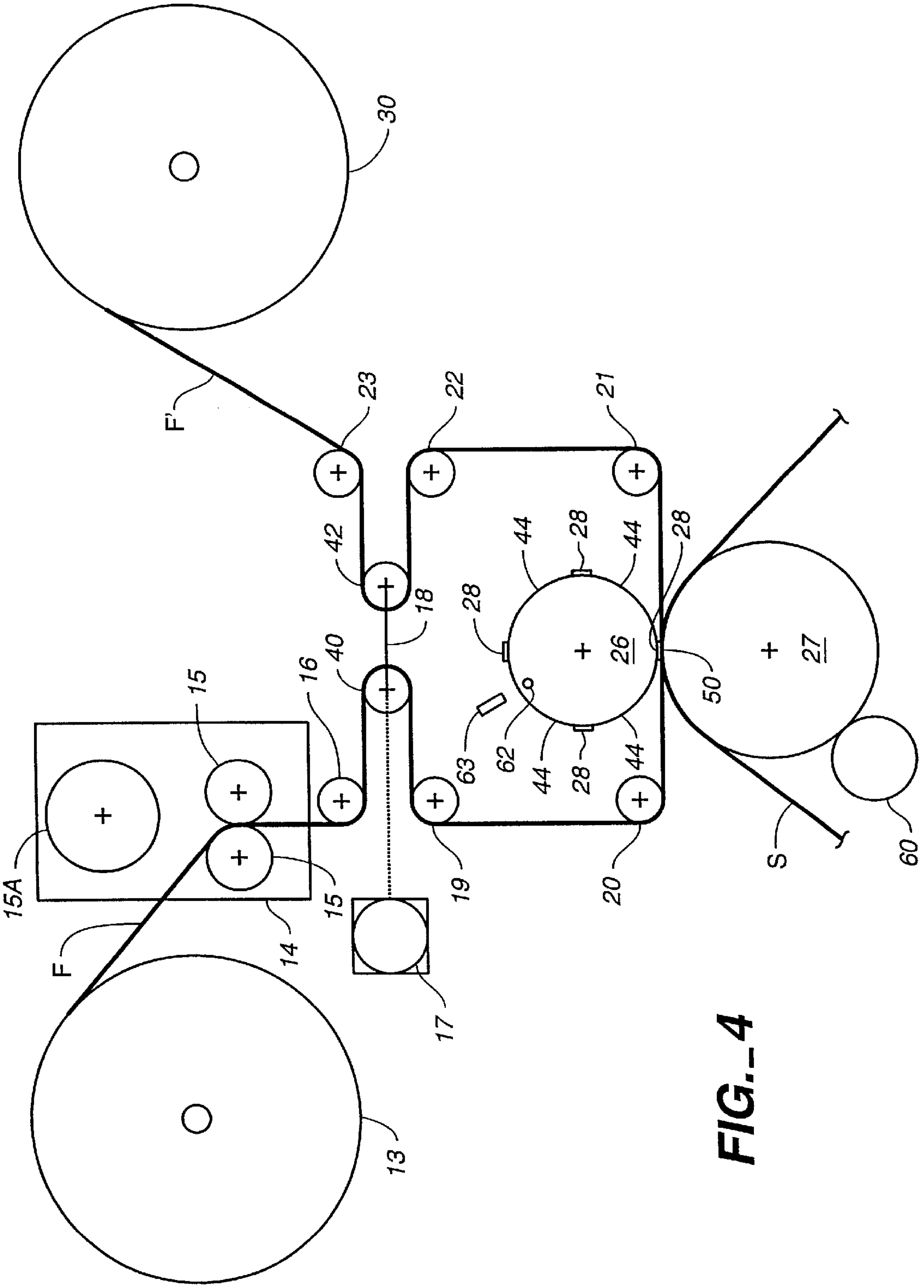
FIG. 4 is a schematic view showing one implementation of the present invention.

Referring to FIG. 4, there is shown a continuous rotary material application apparatus, the material in this example being hot stamp foil, comprising a feed unit 14 for feeding the foil and its supporting carrier, indicated by F. The feed unit 14 has a pair of feed rollers 15 driven by a motor 15A, which unwind the carrier and foil F from an unwind supply roll 13 driven at a speed which is a fraction of the speed of the substrate S. The foil F passes over a guide roller 16 and into a shuttle mechanism 18 to be hereinafter described. After leaving the shuttle mechanism 18, the foil F is looped around guide rollers 19, 20, between an impression roller 26 and an anvil roller 27, around guide rollers 21, 22, back through the shuttle mechanism 18, over another guide roller 23 to a collector roll 30 for scrap foil F'. All of the rollers and rolls just described are constrained to rotate about axis that are fixed with respect to one another, except for the rollers of the shuttle mechanism to be described below.

The carrier and foil composite F in FIG. 4 is moving forward continuously under correct tension from the feed rollers 15 and the collector roll 30. The substrate S, onto which the decoration of the foil is to be stamped, is also moved continuously between the impression roller 26 and anvil roller 27 between supply and take up rolls (not shown) but at a much higher rate of speed.

Figure 5:
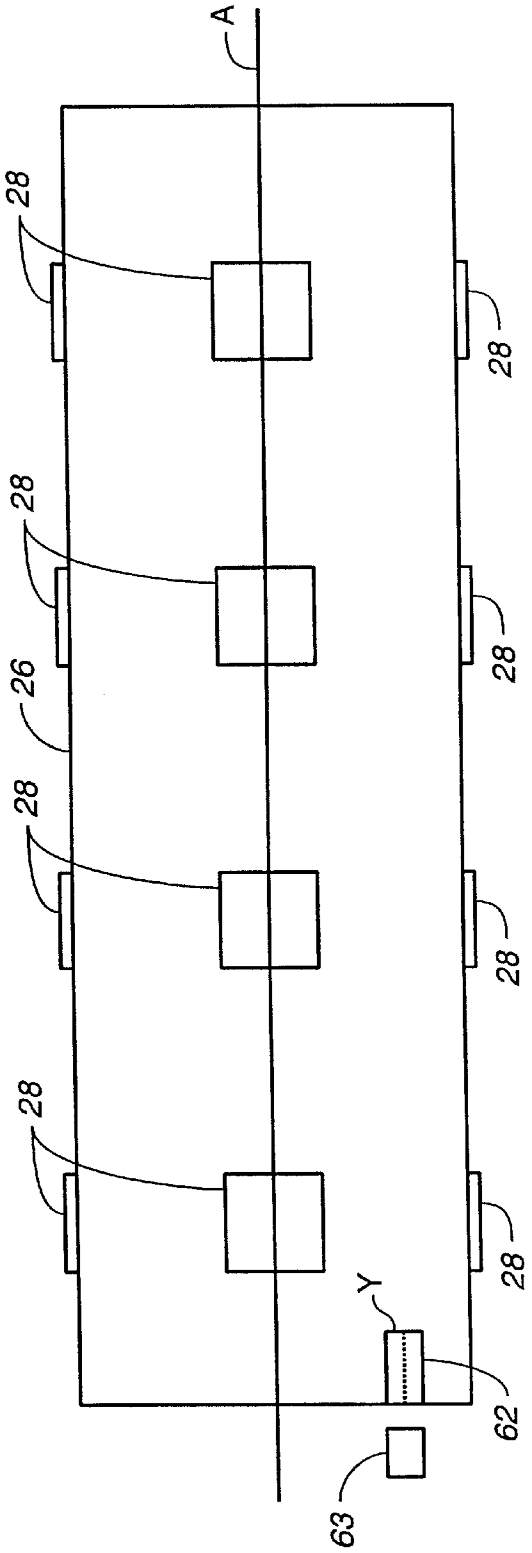
FIG. 5 is a fragmentary view of a feature of the apparatus of FIG. 4 as viewed from the right, 90 degrees from the viewing angle of FIG. 4.

The impression roller 26 has one or more raised areas 28 extending parallel with an axis of rotation of the roller 26 and normally spaced a substantially equal distance apart circumferentially around the roller. There may be one or more such rings of raised areas around the circumference as shown in FIG. 5. The configuration of the raised areas on the die impression roller 26 depends on the nature of the substrate printing and the image to be hot-stamped. For example, if the documents being produced are checks with a height of three inches, and it is desired to hot-stamp a corporate logo which occupies an area of one inch by one inch, then the configuration shown in FIG. 4 would be appropriate. As shown in FIG. 4, there are four raised areas 28 of equal size and surface area spaced 90 degrees apart around the circumference of the roller 26. For the purpose of this description, those portions of the surface of the roller 26 between the raised areas 28 will be referred to as recessed areas 44. The recessed areas 44 are typically of equal size but not necessarily so. In the case just cited, the raised areas 28 would be one inch by one inch, and the circumference of the roller 26 would be a multiple of four inches, typically twelve inches. Similarly if an eleven inch by eight and one half inch document were being produced, there would typically be just one raised area 28, and the roller 26 circumference would be eleven inches. Alternatively, there could be two raised areas, in which case the same result would be achieved by a roller having a circumference of twenty-two inches.

The impression roller 26 and anvil roller 27 are the major components of a foil transfer station. As the rollers 26 and 27 rotate, the only portions of the impression roller 26 which contact film F passing over the anvil roller 27 are the raised areas 28. In making such contact, the raised areas 28 sequentially create a nip 50 with the anvil roller 27 pinching the adjoining foil F and substrate S under heat and pressure to transfer the layers of the foil F other than the carrier (backing film) to the substrate, with each transfer having an area equal to the surface area of a raised area 28 and a length measured longitudinally of the substrate S equal to the length of each raised area 28 measured circumferentially as viewed in FIG. 4. After the operation of transfer or hot stamping of the decoration layers by means of pressing the heated impression roller raised areas 28 against the foil F, the substrate S and the anvil roller 27, the backing film and other non-transferred portions of the used foil F' are disposed of by feeding onto a powered collector roll 30.

As will be appreciated from viewing FIG. 4, the recessed areas 44 do not contact and pinch the adjoining foil F and substrate S passing over the anvil roller 27. Accordingly, during those intervals when the raised areas 28 are out of alignment with the anvil roller 27, the adjoining foil F and substrate S will not be pinched together and will not transfer any layers of the foil. During such intervals, the adjoining foil F in the area of the impression roller 26 and anvil roller 27 may be moved at a different speed than the speed of the substrate S and the anvil roller surface and may even be moved in a reverse direction.

The shuttle mechanism 18 includes a pair of spaced apart guide rollers 40 and 42 mounted for shuttling movement together toward and away from a stationary motor 17 that powers such movement. The foil F passes over the first of the shuttle guide rollers 40 between guide rollers 16 and 19 which are positioned on the in-feed side of the nip 50 between the impression roller 26 raised areas 28 and the anvil roller 27, and passes over the second of the shuttle guide rollers 42 between guide rollers 22 and 23 which are positioned on the outlet side of such nip 50. Even though the speed of the foil F moving through the feed rollers 15 and over the guide roller 16 is constant, it is possible to vary the speed of the foil F as it passes around guide rollers 19, 20, 21 and 22 and through the nip 50 by moving the shuttle 18 and its guide rollers 40 and 41 toward and away from the motor 17. The motion profile of the shuttle is added or subtracted from the foil motion provided by the feed rollers 15. Such linear movement of the shuttle 18 changes the path length of the intake portion of the foil F, between the rollers 15 and nip 50, by movement of the roller 40. At the same time, an equal and opposite change occurs in the path length of the out take portion of the foil F', between the nip 50 and the take up roll 30, as a result of the same motion of the roller 42.

By this means, the foil can be caused to travel at the same speed as the substrate during the intervals when the heated impression roller raised areas 28 are aligned with the anvil roller 27, and may be moved independently during the intervals when the raised die areas 28 are not aligned with the anvil roller 27 and thus are not pressing the stamping foil F against the substrate S.

Figure 6:
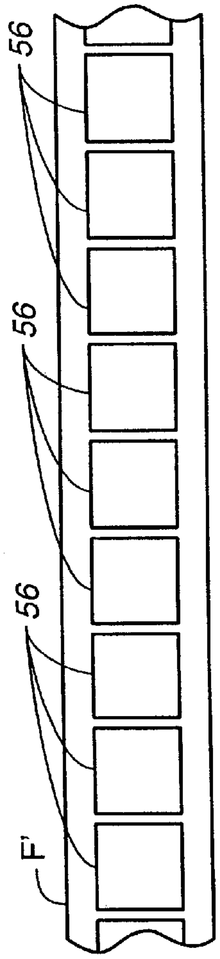
FIG. 6 is a plan view of a length of the foil after passing through the nip of the impression roller and the anvil roller of the machine of FIG. 4 to transfer successive sections of the decorative layer from the carrier sheet to a substrate.

The use of this technique results in a much greater percentage of a given length of foil being useable for stamping and a much lower percentage of foil being scrapped than was heretofore possible. Such effect may be seen by viewing FIG. 6 which shows a used length of used or scrap stamping foil F'. As may be clearly seen, the portions of the used foil F' which were transferred to the substrate S are illustrated as windows 56, each of which consists solely of the carrier as the remaining layers making up the foil F have been transferred by the raised impression roller areas 28 to the substrate S. As can be readily seen by comparing FIGS. 3 and 6, the windows 56 of the used foil F' are much closer together than the windows 12 of the used foil 7 (FIG. 3) of the conventional method of and apparatus for hot stamping. Therefore, a much greater percentage of foil from a given roll can be used for hot stamping under the method and apparatus of the present invention than was previously possible. The result is much less scrap and much greater efficiency than as heretofore been possible.

The shuttle mechanism 18 of FIG. 4 is controlled by a motor 17 which is programmed to accelerate and decelerate that portion of the continuously moving foil F passing between the impression roller 26 and the anvil roller 27 when a gap exists between them; that is, when the impression roller areas 44 are opposite the anvil roller 27. A stepper motor is the preferred motor type, although other motors such a AC or DC servo motors with position feedback are possible.

Actuation of the motor 17 to move the shuttle 18 is effected by means of a microprocessor which receives signals from a continuous position indicator, for example an optical encoder or resolver 60 sensing the substrate position, and one or more sensors 63 indicating the position of the impression roller 26.

The impression roller 26 shown in FIG. 4 is provided with a four sensor targets 62, corresponding to the four raised areas 28. There could be a greater or fewer number of raised areas 28; however, the number of sensor targets 62 should be equal to the number of raised areas 28. Alternatively one sensor target could be used and the target function for the remaining raised areas 28 could be synthesized by counting the appropriate number of encoder pulses corresponding to the distance between raised areas 28. Each of the sensor targets 62 extends along an axis Y which is positioned to be aligned with a fixed sensor 63 once during each revolution of the impression roller 26. The purpose of the sensor/sensor target is to synchronize the motion profile of the shuttle with the times at which the raised areas 28 create a nip 50 with the anvil roller 27.

Any rollers which are accelerated and decelerated as a result of the motion of the shuttle, for example in FIG. 4, rollers 40, 42, 19, 20, 21, and 22, are preferably not driven by the action of the foil passing over them, i.e. they should not be idler rollers. The accelerations occurring at these points will usually be too high to expect the foil to drive them. Accordingly two methods of overcoming this have been found to be effective. The rollers can be driven in such a manner such that their surface speeds exactly match the speed of the foil passing over them, or they can be non-rotating, low friction bars rather than rollers. Examples of both types have been tested, and although they were both successful, the best design was found to be non-rotating bars, perforated and fed with compressed air, such that the foil floats on a cushion of air, thus adding neither inertia or friction to the motion of the foil F. This type of "air bar" is used in many other applications where webs of material need to be manipulated with very low friction. The use of these air bars allows a simplification in the arrangement of the configuration of FIG. 4, as shown in FIG. 7.

Figure 7:
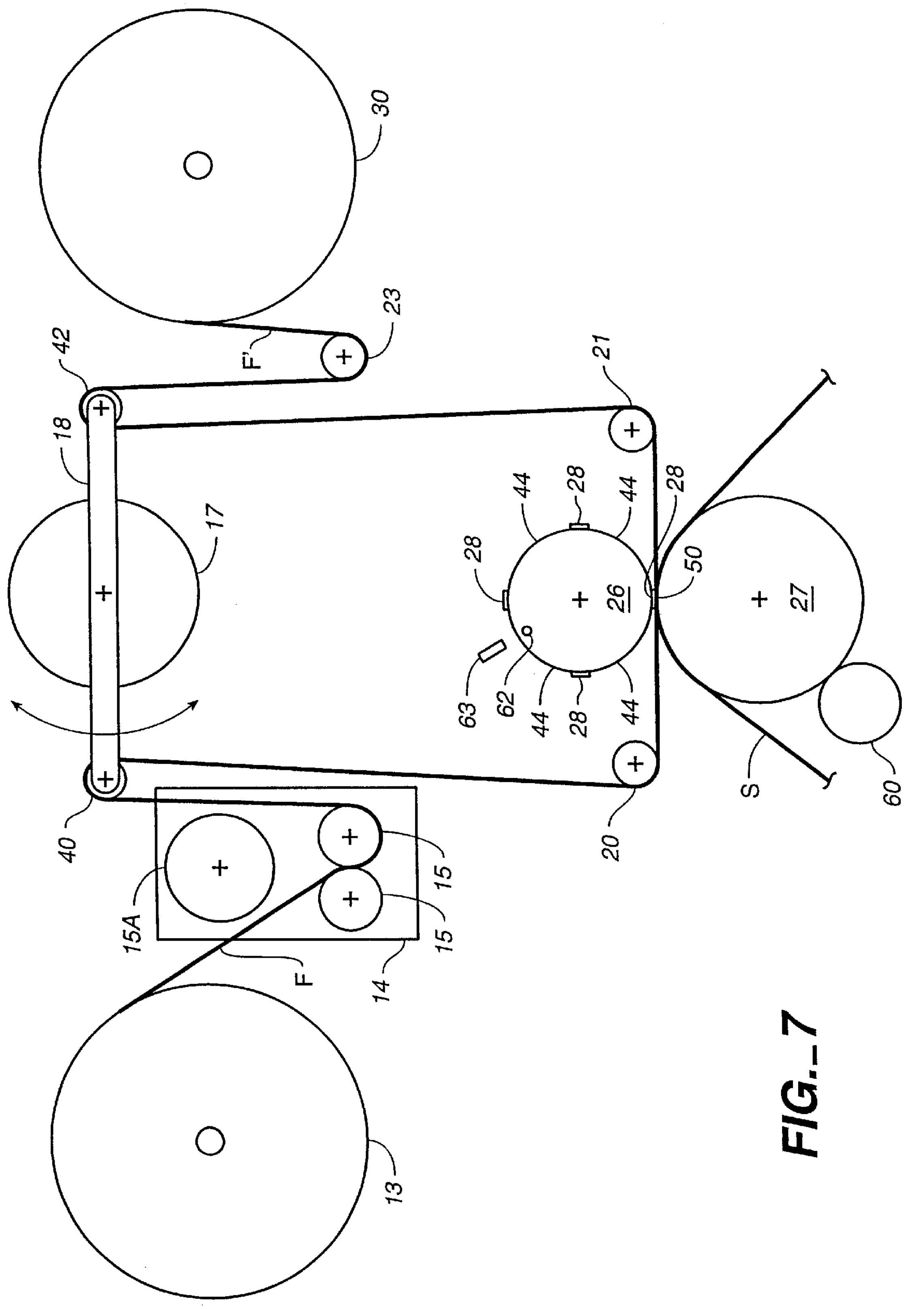
FIG. 7 is a schematic view showing another implementation of the present invention.

In principle, a preferred configuration shown in FIG. 7 is identical with that of FIG. 4. However, the mechanical arrangement is slightly different. The difference lies principally in the method of moving the shuttle. In this case, the two shuttle rollers 40 and 42 are carried on a pivoting arm which is mounted directly on a powered rotating shaft of the otherwise stationary shuttle drive motor 17. This arrangement greatly reduces the number of moving parts, thus permitting higher speed operation while increasing reliability. This design is not conducive to utilizing rollers which are powered to exactly match the velocity of the foil as it passes over them, and therefore, in order to avoid having to accelerate them using the foil to drive them, non-rotating bars are used at positions 40, 20, 21, and 42. While it is possible to use low-friction materials such as Teflon at these positions, air flotation bars are preferred.

The graph shown in FIG. 8A is a plot of velocity vs. time for the major components of the mechanism embodiments of FIGS. 4 and 7. The horizontal line S represents the velocity of the substrate, and the horizontal line F represents the velocity of the foil at the feed rollers 15. The curve A-B-C-D-E-A' represents the motion of the foil imparted by the shuttle. (Note this is not the shuttle motion, since a motion of the shuttle imparts twice that motion to the foil). The curve F-G-H-I-J-F' is the algebraic sum of curve A-B-C-D-E-A' and line F, and represents the velocity of the foil F at the nip 50. Occurrences of portions G-H and G'-H' of the velocity curve of FIG. 8A correspond to successive raised areas 28 passing through the nip 50.

There are two constraints which the system should satisfy:

(1) The velocity of the foil during engagement of the nip N should substantially match the substrate velocity S, as shown by the G-H portion of the foil velocity curve that falls on the line S representing the velocity of the substrate S, and (2) The area under the curve A-B-C-D-E-A' should be substantially zero. This rule may be violated if there is more than one die around the circumference, and they are not spaced equally. Even in this case the area under the curve after a complete revolution of the impression roller 26 should be substantially zero.

Figure 8:
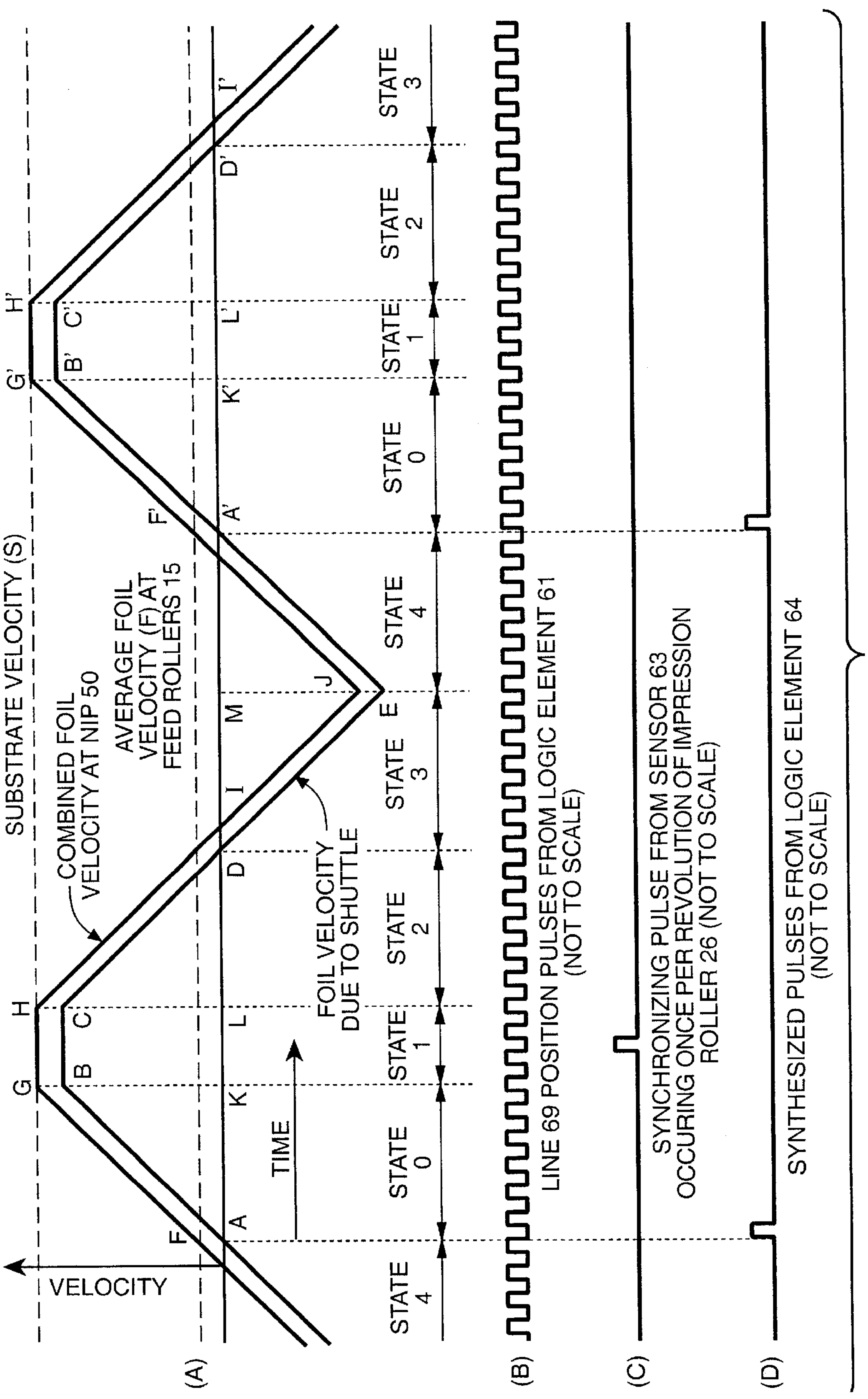
FIG. 8A are velocity vs. time curves for a typical set of operating conditions of the machines of FIGS. 4 and 7.
FIGS. 8B–D show, in a time relationship to the curves of FIG. 8A, various pulses generated in a control system of the machines of FIGS. 4 and 7.

A third constraint which is desirable, but not absolutely necessary, is that the two curves of FIG. 8 be continuous, i.e., that the point F' corresponds in a subsequent cycle to the point F of the cycle shown, and the point A' corresponds in a subsequent cycle to the point A of the cycle shown. While it is possible for the shuttle to complete its travel before the next cycle begins, it is advantageous to allow the shuttle all the time available to complete its cycle.

Although the acceleration and deceleration lines A-B, C-D, D-E, E-A', F-G, H-I, I-J, J-F', are shown as straight lines depicting constant acceleration or deceleration, they may have different shapes, such as "S" curves, to provide smoother motion at the expense of an increase in the maximum required acceleration.

Although FIG. 8 depicts the substrate moving at a constant velocity S, it is an important feature of the invention that the algorithms used to calculate and control the velocity of the shuttle 18 and the feed rollers 15 are based on the instantaneous position of the substrate, not its velocity, so that the motion of the carrier/foil F remains correct if the substrate changes speed, or even starts and stops.

It is useful to provide the following definition of terms:

(1) Impression Roller repeat, (I), is the circumference of the impression roller 26, as measured at the outside diameter of raised areas 28;

(2) Impression repeat, (P), is the distance between the center of one raised area 28 of the impression roller 26 to the center of the next raised area 28, as measured at the outside diameter of the raised areas 28;

(3) Die size, is the length of one of the raised areas 28 on the impression roller, measured around the circumference of the impression roller 26; and (4) Effective Die Size, (D), is the die size plus a small tolerance allowance.

The motion of the feed rollers 15 is derived by dividing the positional information stream of the encoder 60 by a value dependent on the ratio between the impression repeat and the substrate document repeat.

As an example, if each pulse from the encoder 60 represents 0.001" of travel, there is a single die having an effective die size of 1 inch, and the document repeat and impression roller repeats are 11", then the feed rollers 15 must be driven 0.001" for each 11 encoder pulses, thus driving the foil at one eleventh of the substrate speed. A stepper motor provides the simplest means of providing this function, since the microprocessor need only divide the incoming encoder data stream by the calculated ratio and feed the divided stream to the stepper motor, although other motors such a AC or DC servo motors with position feedback will also accomplish the same result.

For any given values of impression repeat P and effective die size D, the following parameters are calculated for shuttle control:

The length of a foil forward motion acceleration ramp, (provided by the shuttle), R(f)=(P-D)/8*(1-D/P)^2

(Corresponding to both the area A-B-K and area L-C-D).

The length of foil reverse motion acceleration ramp, (provided by the shuttle),

R(b)=(P-D)/8*(1+D/P)^2

(Corresponding to both the area D-E-M and area M-E-A'). other similar encoder or resolver which is capable of providing digital positional information. In the case of the encoder, there typically are two square-wave streams of data, phased 90 degrees from each other. A standard logic element 61, such as LSI 7804, is used to convert these two streams into step signals and direction signals. In the preferred embodiment, the encoder 60 and logic 61 are configured to provide a pulse for each 0.001 inches of substrate travel. Although it is not absolutely necessary to provide direction signals since the substrate typically only moves in one direction, machine vibrations can cause the encoder 60 to emit pulses which would result in false information if direction was not taken into account.

In the preferred embodiment, the sensor 63 is most conveniently positioned such that a single sensor target 62 produces an output signal once per revolution of the impression roller 26 when any one of the raised areas 28 is centered at the six o'clock position 50 (FIG. 7), as shown in FIG. 8C. The signal from the sensor 63 is conditioned by the logic element 64 to offset the signal positionally such that the output signal of the logic element 64 occurs at point A of a curve of FIG. 8A and to synthesize like pulses corresponding to the remaining raised areas 28, as shown in FIG. 8D. In order to provide these signals, the logic element 64 receives repeat pattern information entered by the operator and conditioned by the microprocessor 65, and positional information in the line 69.

Digital command pulses for the drive motor 15 are produced by a variable divider 66 that divides the pulse stream (FIG. 8B) in the line 69 from the encoder pulses, after being conditioned by the logic 61, by a value determined by the microprocessor 65. These The length of the foil forward motion in constant-speed section, (provided by the shuttle),

L=D*(P-D)/P (Corresponding to the area K-B-C-L).

Since the shuttle motion is to be based on substrate motion, not time, the shuttle is controlled in a manner similar to the feed rollers 15. In order to effect the acceleration and deceleration profiles, tables of values are used. These tables contain the number of encoder counts required for each step of the shuttle motor at each stage of the acceleration or deceleration. The values in the table establish the nature of the acceleration/deceleration profiles. For the simplest and fastest case, i.e. constant acceleration and deceleration, the values are calculated using the following equation:

Table value(E)=2/(1+D/P)*(r*R(b))^0.5, where the integer 'r' is the step number, varying from 1 to R(b).

Since the parameters required for the table calculation do not change during operation, it is advantageous to precalculate the table values.

For the example cited earlier i.e. a single die having an effective size D=1 inch, and document repeat and impression roller repeats of 11", the calculations produce the following results:

R(f)=1.033 inches

R(b)=1.487 inches

L=0.909 inches

Figure 9:
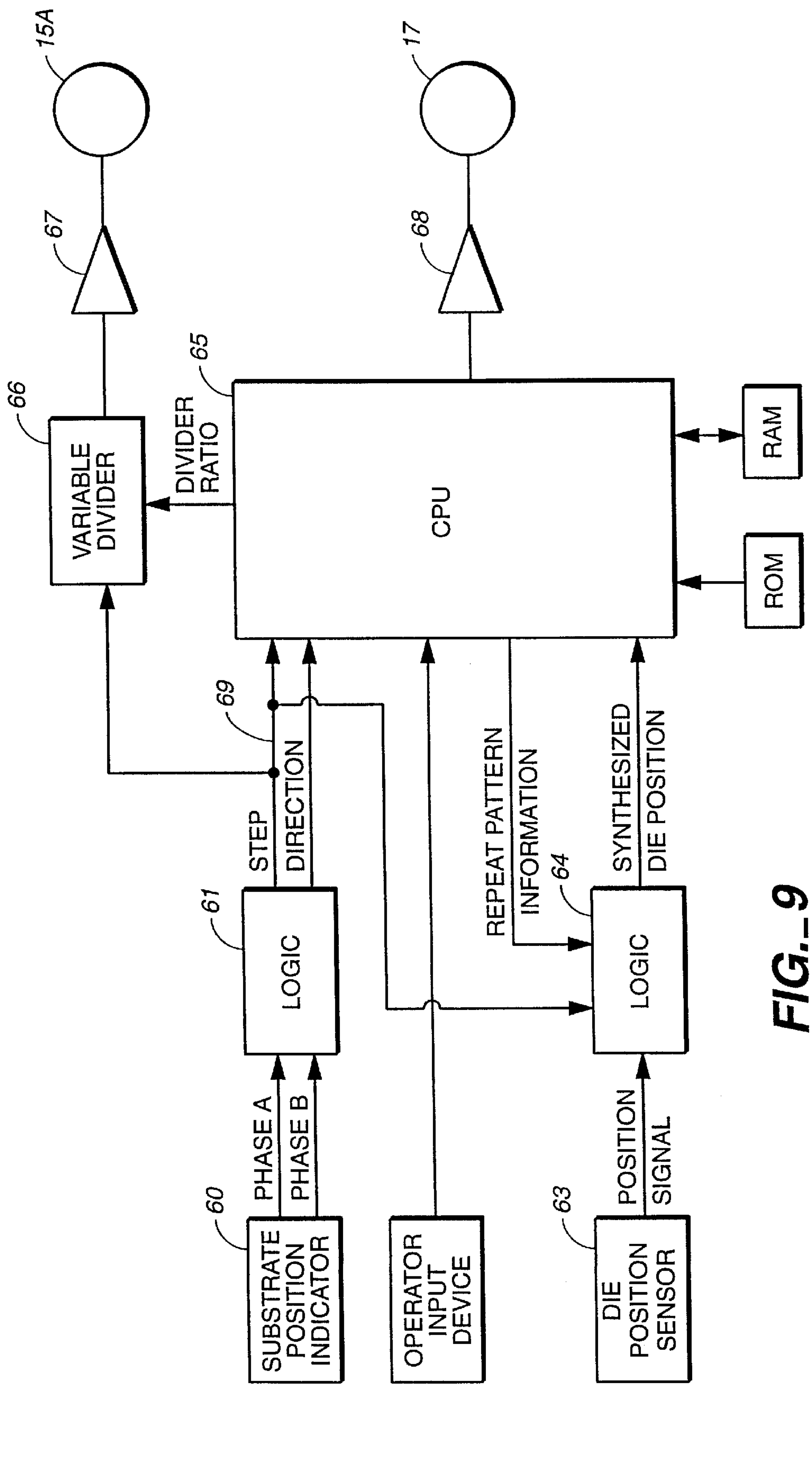
FIG. 9 is an electronic block diagram of a control system for the machines of FIGS. 4 and 7.

The circuit block diagram shown in FIG. 9 outlines the electronic circuitry utilized in the invention. Continuous position information is provided by a rotary encoder 60 such as Model 755A manufactured by Encoder Products, although it is possible to use any command pulses are conditioned and amplified by drive amplifier 67 to drive motor 15A.

Figure 10:
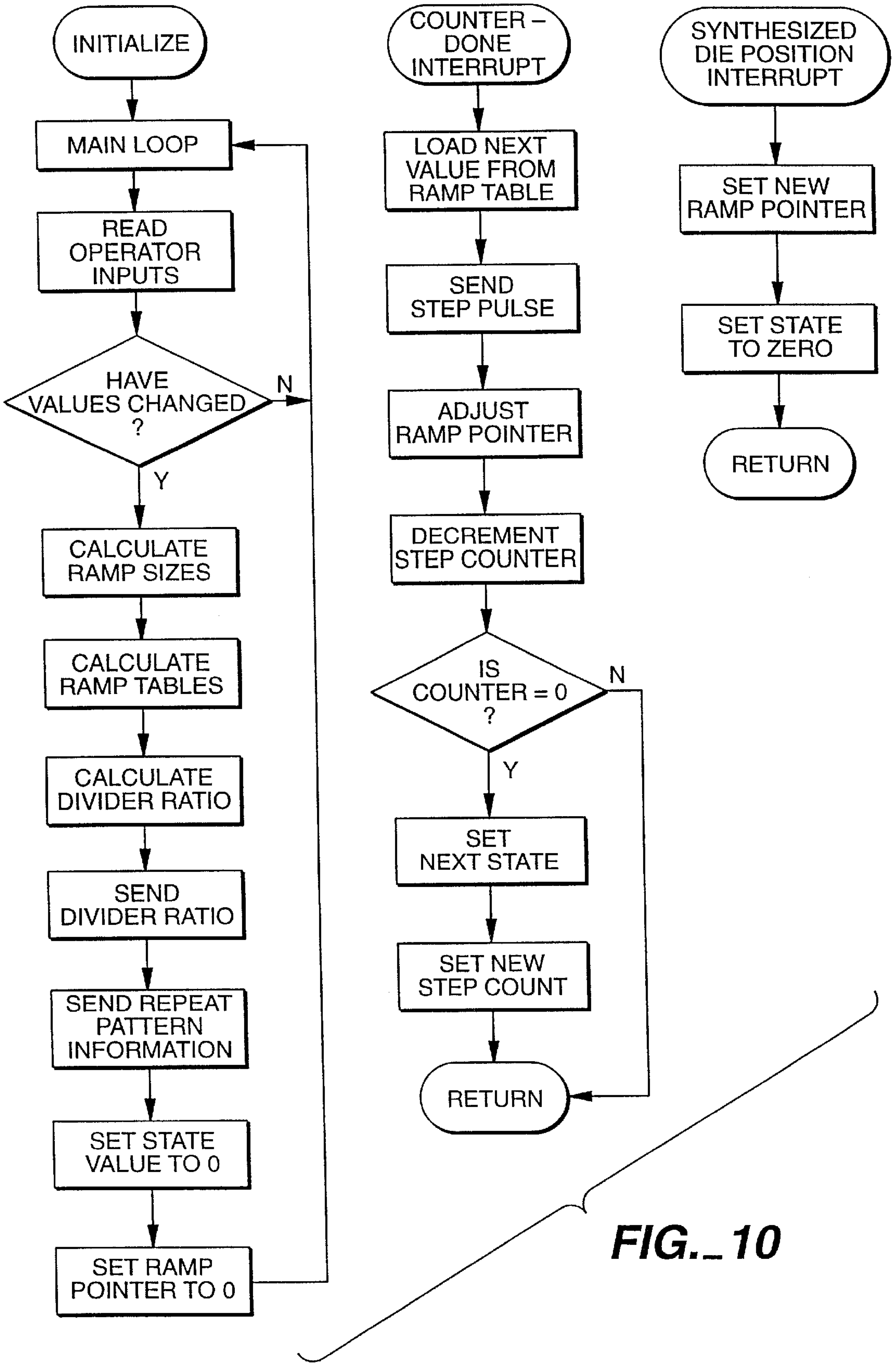
FIG. 10 is a flow chart showing the principal aspects of the program flow of the microprocessor (CPU) of FIG. 9.

The digital command pulses for the drive motor 17 are produced by the microprocessor 65 in accordance with the flow chart FIG. 10. At power up, the program goes through an initialization process which serves principally to establish the microprocessor configuration and to set initial conditions. The main program loop reads the input parameters set by the operator and computes the system parameters appropriate for those input parameters, including the ramp tables, divider ratio, and repeat pattern data. These values are re-computed any time the input parameters are changed.

Operation of the shuttle motor 17 is divided into five states, as illustrated in FIG. 8. Although the acceleration and deceleration values may be different for states 0, 2, 3, & 4, this has not been found to be necessary. Accordingly these four states utilize the same ramp table. State 1 does not require a table, merely being a single value.

After the initialization process, a counter, which may be internal to the microprocessor or a separate logic device, is loaded with the first value from the computed table. The counter is counted down by the conditioned step and direction signals from logic element 61, and an interrupt is caused to occur upon its expiration. The interrupt routine loads the next value into the counter, advances the ramp pointer, sends a step signal to drive amplifier 68, and tests for completion of the current state. If the state is completed, the state counter is incremented unless the current state value is four, in which case it too is set to zero. At the same time, the ramp pointer is set to zero if the new state is 0 or 3, and to the top of their respective ramps if the new state is 2 or 4. If the new state is 3 or 4, the motor direction signal is set to reverse, in other cases it is set to forward. At the transition between state 2 and state 3, an accounting is made of the number of steps which have been made in the forward direction, and this value is used to set the number of steps to be moved in the reverse direction so that the net shuttle movement after one cycle is zero.

The microprocessor receives an additional interrupt (FIG. 8D) from logic element 64, causing it to enter the synthesized die position interrupt routine as shown in FIG. 10. This interrupt sets the state value and ramp pointer to 0, thus synchronizing the shuttle motion with that of the impression roller.

Although the various aspects of the present invention have been described with respect to its preferred embodiments, it will be understood that the invention is entitled to protection within the scope of the appended claims.

What is claimed is:

1. A machine for transferring discrete areas of material from a flexible carrier onto a substrate at locations spaced apart along the substrate, comprising:

a transfer station through which said substrate and said carrier pass between an input and output thereof, a transfer station including at least one contact area that periodically urges the carrier against the substrate while moving therewith to transfer discrete areas of material from the carrier to the substrate but otherwise allows relative movement between the carrier and substrate within the transfer station, means for moving said substrate through the transfer station with a first velocity profile, a first sensor of the movement of said substrate through the transfer station, means responsive to said first sensor for supplying said carrier to said transfer station with a second velocity profile that is a fraction less than unity of said first velocity profile, a second sensor of the periodic urging by said at least one contact area of the carrier against the substrate, and means responsive to said first and second sensors for simultaneously adjusting by equal and opposite amounts path lengths followed by the carrier on the input and output sides of the transfer station in a manner that moves a segment of the carrier within the transfer station according to a third velocity profile that, when combined with said second velocity profile, causes the carrier to move through the transfer station with a fourth velocity profile having a value equal to that of the substrate when said at least one contact area is urging the carrier against the substrate but otherwise having a velocity that is significantly less than that of the substrate, thereby to efficiently utilize the material from the carrier.

2. The machine of claim 1, wherein said first and second velocity profiles each consist of a substantially constant velocity of different values.

3. The machine of claim 1, wherein the carrier path length adjusting means includes an electric motor and means for controllably energizing said motor.

4. The machine of claim 3, wherein the motor energizing means includes a microprocessor based electronic control system.

5. The machine of claim 3, wherein said electric motor includes a stepper motor.

6. The machine of claim 3, wherein said electric motor includes a servo motor.

7. The machine of any one of claims 1, 2, 3 or 4, wherein said carrier path length adjusting means includes first and second guides respectively positioned on the input and output sides of the transfer station in a path of the carrier by a shuttle mechanism.

8. The machine of claim 7, wherein said shuttle mechanism includes means for moving said first and second guides back and forth along a linear path.

9. The machine of claim 7, wherein said shuttle mechanism includes means having at least one arm held to pivot about a point and to which said first and second guides are attached for moving said first and second guides back and forth along arcuate paths.

10. The machine of claim 1, wherein said transfer station includes first and second rollers between which the substrate and carrier are moved, said at least one contact area being positioned around a circumference of the second roller and with respect to the first roller to urge the carrier against the substrate when said at least one contact area is positioned opposite said first roller but otherwise allowing relative movement of the carrier and substrate between said first and second rollers.

11. The machine of claim 10, wherein said second sensor is coupled with the second roller to provide a first signal related to a rotational position of said at least one contact area of the second roller.

12. The machine of claim 11, wherein said first sensor is coupled with the first roller to provide a second signal related to the velocity of the substrate through the transfer station.

13. The machine of either claims 11 or 12, wherein the carrier path length adjusting means includes an electric motor, and the machine additionally comprises a microprocessor based electronic control system receiving at least said first signal for controllably energizing said electric motor in a manner to drive the carrier through the transfer station with said third velocity profile.

14. The machine of claim 1, wherein said substrate moving means is characterized by moving a continuous length substrate through the transfer station.

15. A machine for transferring discrete areas of material from a flexible continuous carrier onto a substrate at locations spaced apart along the substrate, comprising:

a transfer station through which both of the substrate and the carrier pass adjacent to each other, wherein the transfer station includes at least one contact area that repetitively presses the carrier against the substrate and allows relative movement between the carrier and substrate in the transfer station between the repetitive presses of the carrier against the substrate, a first mechanism that moves the substrate to and through the transfer station, a second mechanism that supplies the carrier to the transfer station at a speed significantly less than a speed of movement of the substrate through the transfer station, and a carrier movement control mechanism that comprises:

a first sensor of the first mechanism that provides a first signal related to the movement of the substrate through the transfer station, a second sensor providing a second signal related to the repetitive instances of said at least one contact area urging the carrier against the substrate in the transfer station, a carrier handling assembly including at least a first electrical motor that causes the carrier to be supplied to the transfer station, a carrier control mechanism including at least a second electrical motor that positions at least first and second guides to change path lengths followed by the carrier on opposite sides of the transfer station by equal and opposite amounts, and an electronic control system that utilizes both of the first and second signals to drive the first and second electrical motors in a manner to move the carrier within the transfer station with a velocity that is equal to that of the substrate when said at least one contact area is pressing the carrier against the substrate but otherwise moves the carrier in a manner that advances significantly less of the carrier than substrate through the transfer station between the repetitive instances of said at least one contact area pressing the carrier against the substrate.

16. The carrier movement mechanism of claim 15, wherein the electronic control system includes a microprocessor that actively calculates parameters for driving the first and second electrical motors.

17. The carrier movement mechanism of claim 5, wherein at least one of said at least a first electrical motor and at least a second electrical motor includes a stepper motor.

18. The carrier movement mechanism of claim 15, wherein at least one of said at least a first electrical motor and at least a second electrical motor includes a servo motor.

19. The carrier movement mechanism of any one of claims 15–18, wherein said first and second guides of the carrier control mechanism are moved back and forth by said at least a second motor along a linear path.

20. The carrier movement mechanism of any one of claims 15–18, wherein said carrier control mechanism includes at least one arm to which said first and second guides are attached a distance from a point about which said at least a second motor pivots said at least one arm back and forth, thereby to move the first and second guides back and forth along arcuate paths.

21. A machine for transferring discrete areas of material from a flexible carrier onto a substrate at locations spaced apart along the substrate, comprising:

a transfer station, wherein the transfer station includes at least one contact area that repetitively presses the carrier against the substrate and allows relative movement between the carrier and substrate in the transfer station between the repetitive presses of the carrier against the substrate, a mechanism capable of moving a continuous length of the substrate through the transfer station, and a carrier movement control mechanism that comprises:

a first sensor of the substrate moving mechanism that provides a first signal related to the movement of the substrate through the transfer station, a second sensor providing a second signal related to the repetitive instances of said at least one contact area urging the carrier against the substrate, a carrier handling assembly including at least a first electrical motor that causes the carrier to be supplied to the transfer station, an assembly including at least a second electrical motor that controls the velocity of the carrier through the transfer station during intervals when the carrier is not being pressed against the substrate, wherein said carrier velocity controlling assembly includes first and second carrier path guides with their positions being moved by said at least a second electrical motor to adjust the path lengths of the carrier station by equal and opposite amounts before and after passing through the transfer station, and an electronic control system that utilizes both of the first and second signals to drive the first and second electrical motors in a manner to move the carrier within the transfer station with a velocity that is equal to that of the substrate when said at least one contact area is pressing the carrier against the substrate but otherwise moves the carrier in a manner that advances significantly less of the carrier than substrate through the transfer station between the repetitive instances of said at least one contact area pressing the carrier against the substrate.

* * * * *